United States Patent
Kinpara et al.

(10) Patent No.: US 7,790,267 B2
(45) Date of Patent: Sep. 7, 2010

(54) WORKPIECE BORING/CUTTING OPERATION AIDING PLATE MATERIAL AND MOLDING MAKING USE OF THE SAME

(75) Inventors: Yasuhito Kinpara, Tokyo (JP); Makoto Iida, Tokyo (JP)

(73) Assignee: PS Japan Corporation, Tokyo (JP)

( * ) Notice: Subject to any disclaimer, the term of this patent is extended or adjusted under 35 U.S.C. 154(b) by 434 days.

(21) Appl. No.: 11/795,388

(22) PCT Filed: Jan. 30, 2006

(86) PCT No.: PCT/JP2006/301434

§ 371 (c)(1),
(2), (4) Date: Jul. 17, 2007

(87) PCT Pub. No.: WO2006/080489

PCT Pub. Date: Aug. 3, 2006

(65) Prior Publication Data

US 2008/0124564 A1    May 29, 2008

(30) Foreign Application Priority Data

Jan. 31, 2005    (JP)    ............................. 2005-023630

(51) Int. Cl.
*B32B 15/00* (2006.01)
(52) U.S. Cl. .................. 428/209; 428/301.1; 428/304.4
(58) Field of Classification Search ................ 428/209, 428/301.1, 304.4, 221
See application file for complete search history.

(56) References Cited

U.S. PATENT DOCUMENTS

| | | | |
|---|---|---|---|
| 7,473,458 B2 * | 1/2009 | Takai et al. ................ | 428/209 |
| 7,535,095 B1 * | 5/2009 | En et al. ..................... | 257/701 |
| 7,615,277 B2 * | 11/2009 | Takai et al. ................ | 428/209 |
| 2005/0025955 A1 * | 2/2005 | Kuriu et al. ............... | 428/304.4 |
| 2008/0124564 A1 * | 5/2008 | Kinpara et al. ............ | 428/523 |

FOREIGN PATENT DOCUMENTS

| | | | |
|---|---|---|---|
| JP | 2-24012 A | | 1/1990 |
| JP | 05-295172 | * | 11/1993 |
| JP | 7-173330 | | 7/1995 |
| JP | 10-308566 A | | 11/1998 |
| JP | 2000-95907 A | | 4/2000 |
| JP | 2000095907 | * | 4/2000 |
| JP | 2001-232596 A | | 8/2001 |
| JP | 2002-294070 A | | 10/2002 |
| JP | 2003-53698 A | | 2/2003 |
| JP | 2003-313313 A | | 11/2003 |
| JP | 2004-2593 A | | 1/2004 |
| JP | 2005-307087 A | | 11/2005 |

* cited by examiner

*Primary Examiner*—N. Edwards
(74) *Attorney, Agent, or Firm*—Birch, Stewart, Kolasch & Birch, LLP

(57) ABSTRACT

A workpiece boring/cutting operation aiding plate material comprising a rubber-containing styrene resin composition and an inorganic filler, wherein these are compounded in a weight ratio of 80:20 to 40:60; and a molding making use of the same.

11 Claims, 1 Drawing Sheet

WORKPIECE BORING/CUTTING OPERATION AIDING PLATE MATERIAL AND MOLDING MAKING USE OF THE SAME

TECHNICAL FIELD

The present invention relates to a workpiece drilling and cutting operation aiding plate material which is low in specific gravity and excellent in drilling properties and cutting properties, and can be material recycled, and a molded article made from the same.

BACKGROUND ART

In the field of electronic parts, thermosetting resins are widely used in many industrial members used not only for final products, but also in working steps. As the industrial members, mention may be made of, for example, foundation boards called backup boards used in drilling of printed circuit boards and covers called entry boards inhibiting attachment of cutting powders in exterior working of substrates of printed circuit boards. For these materials, there are generally used phenolic resins which are thermosetting resins.

Recently, for taking care of environments, it is of urgent necessity to utilize recycled materials and to diminish industrial wastes which may damage environments. Therefore, it becomes active to reconsider various products or materials constituting the products, while thermosetting resins cannot generally be recycled in the form of resins. In addition, they are too high in quantity of heat generated in thermal recycling which utilizes them as resources for incinerators, and hence the present furnaces are damaged and cannot perform disposal in many cases. For these reasons, many thermosetting resins are used for reclamation as industrial wastes. However, recently, the reclamation per se must be avoided because of reduction in intake of industrial wastes by disposal places and besides from the point of environmental protection of the earth.

On the other hand, the technology of high density assembling in the field of electronic assembly much progresses, and in drilling operation, the diameter of drills further decreases. Thus, demand for backup boards excellent in drilling properties increases. In addition, backup boards made of phenolic resins are great in warpage and distortion due to the change in humidity, and severe inventory control is needed, which is serious burden on manufacturers and users.

In entry boards, the demand for material recycling also becomes greater as in the case of backup boards.

Patent Document 1 proposes a workpiece drilling and cutting operation aiding plate which comprises a composition composed of an inorganic filler powder of magnesium hydroxide or aluminum hydroxide and a binder comprising a polyolefin. It is disclosed that the positional accuracy of holes in drilling operation is high and the plate can be recycled and is economically advantageous. However, since the composition mainly comprises inorganic filler powder, the product is very heavy due to its high specific gravity and sometimes becomes difficult to handle in actual use.

Patent Document 2 proposes a foundation board which is used in drilling operation for substrates of printed circuit boards and can be recycled, and is improved in surface smoothness.

According to the foundation board, recycling is possible and drilling quality of printed circuit boards can be ensured. However, this foundation board still cannot necessarily be satisfied for great reduction of diameter of drill used for drilling which is necessary for meeting the recent demand for high density assembly. Specifically, there are problems that drilling quality is adversely affected by sticking of cutting powders to drills, and there is the possibility of drills being broken.

Patent Document 1: Japanese Patent No. 1883901
Patent Document 2: JP-A-2003-53698

DISCLOSURE OF INVENTION

Problem to be Solved by the Invention

The present invention has been made for solving the above problems, and an object of the present invention is to provide a workpiece drilling and cutting operation aiding plate material which is low in specific gravity, excellent in drilling properties and cutting properties, and can be material recycled, and a molded article made from the same.

Means for solving the Problem

As a result of intensive research conducted by the inventors in an attempt to solve the above problems, it has been found that a material containing a rubber-containing styrene resin composition and an inorganic filler at a specific ratio can attain the object, and thus the present invention has been accomplished.

That is, the present invention is as follows.

(1) A workpiece drilling and cutting operation aiding plate material which comprises a rubber-containing styrenic resin composition (A) and an inorganic filler (B) in a weight ratio of 80:20-40:60.

(2) The workpiece drilling and cutting operation aiding plate material described in (1), wherein the inorganic filler (B) is at least one member selected from the group consisting of wollastonite, talc and glass flake.

(3) The workpiece drilling and cutting operation aiding plate material described in (1) or (2) which additionally comprises a lubricant (C) in an amount of 0.5-5 parts by weight based on 100 parts by weight in total of the rubber-containing styrenic resin composition (A) and the inorganic filler (B).

(4) The workpiece drilling and cutting operation aiding plate material described in (3), wherein the lubricant (C) is a higher fatty acid or a metal salt thereof.

(5) The workpiece drilling and cutting operation aiding plate material described in any one of (1)-(4), wherein a rubber content originating from the rubber-containing styrene resin composition (A) in the material is 2% by weight or more based on the total weight of the rubber-containing styrenic resin composition (A) and the inorganic filler (B).

(6) The workpiece drilling and cutting operation aiding plate material described in any one of (1)-(5), wherein the inorganic filler (B) is wollastonite.

(7) The workpiece drilling and cutting operation aiding plate material described in any one of (1)-(6), wherein the inorganic filler (B) is wollastonite having an aspect ratio of 3-30.

(8) The workpiece drilling and cutting operation aiding plate material described in any one of (1)-(7), wherein the inorganic filler (B) is wollastonite having an average fiber length of 10-200 μm and an average fiber diameter of 2-30 μm.

(9) The workpiece drilling and cutting operation aiding plate material described in any one of (1)-(6), wherein the inorganic filler (B) is wollastonite having an average fiber length of 10-200 μm, an average fiber diameter of 3-20 μm, and an aspect ratio of 1-9.

(10) A molded article made from the workpiece drilling and cutting operation aiding plate material described in any one of (1)-(9).

(11) A molded article made by molding a ground product and/or a pelletized product of the molded article obtained in (10) which has been used.

(12) A molded article made by molding the workpiece drilling and cutting operation aiding plate material obtained in any one of (1)-(9) together with a ground product and/or a pelletized product of the molded article described in (10) which has been used.

(13) The molded article described in any one of (10)-(12) which is used as a backup board or an entry board.

Advantages of the Invention

The workpiece drilling and cutting operation aiding plate material of the present invention and the molded article made from the same are low in specific gravity, excellent in drilling properties and cutting properties, and can be material-recycled.

BEST MODE FOR CARRYING OUT THE INVENTION

The present invention will be specifically explained below.

The rubber-containing styrenic resin composition (A) in the present invention is a rubber-containing styrenic polymer containing a rubber-like elastic body. Specifically, it is a polymer which comprises a matrix comprising a styrenic polymer in which a rubber-like polymer is dispersed in the form of particles. Generally, it is obtained by dissolving a rubber-like polymer in a styrenic monomer (and a solution containing an inert solvent), carrying out bulk polymerization, bulk suspension polymerization or solution polymerization with stirring to precipitate a rubber-like elastic body, and granulating the rubber-like elastic body. Alternatively, it may be prepared by adding a rubber component such as a styrenic thermoplastic elastomer to a styrenic polymer containing no rubber.

The styrenic monomers include, for example, styrene, $\alpha$-alkyl-substituted styrene such as o-methylstyrene, p-methylstyrene, m-methylstyrene, 2,4-dimethylstyrene, ethylstyrene and $\alpha$-methylstyrene, isobutylstyrene, tert-butylstyrene, bromostyrene, and chlorostyrene. Styrene is most typical. These may be used each alone or in combination of two or more. In addition to the styrenic monomers, non-styrene monomers such as acrylonitrile and methacrylonitrile may be used in combination with the styrenic monomers. The amount of the non-styrene monomer is 50% by weight or less based on the total monomers. As the rubber-like elastic body, mention may be made of polybutadiene, styrene-butadiene copolymer, polyisoprene, butadiene-isoprene copolymer, natural rubber, ethylene-propylene copolymer, etc. Polybutadiene and styrene-butadiene copolymer are preferred. The content of the rubber-like elastic body is 2-30% by weight, preferably 5-15% by weight based on the rubber-containing styrenic polymer. When the content is 2% by weight or more, there occurs no such problem as breakage of products during handling due to fragility, and when it is 30% by weight or less, rigidity can be maintained. The dispersed rubber particle diameter is suitably 0.1-3.8 µm.

One of the preferred examples of the rubber-containing styrene resin composition (A) in the present invention is a rubber-containing polymethacrylstyrenic resin comprising a rubber-like elastic body as dispersed particles and a polymer comprising a styrenic monomer and a (meth)acrylic ester monomer as a continuous phase. The above resin most highly exhibits the characteristics of the present invention and is preferred. The rubber-containing polymethacrylstyrenic resin of the present invention is a resin which comprises as a dispersed phase a rubber-like elastic body which shows rubber-like properties at normal temperature, such as polybutadiene, a styrene-butadiene copolymer, a hydrogenated (or partially hydrogenated) polybutadiene, a hydrogenated (or partially hydrogenated) styrene-butadiene block copolymer, a styrene-propylene copolymer, styrene-propylene-non-conjugated terpolymer, polyisoprene, an isoprene-styrene copolymer, or a silicone rubber; and as a continuous phase a copolymer of a styrenic monomer such as styrene, $\alpha$-methylstyrene, p-methylstyrene, p-t-butylstyrene and a (meth) acrylic ester monomer such as methyl methacrylate, ethyl methacrylate, butyl methacrylate, methyl acrylate, ethyl acrylate, butyl acrylate, 2-ethylhexyl acrylate or cyclohexyl acrylate.

As the styrenic monomer constituting the continuous phase, styrene is particularly suitable. As the (meth)acrylic ester monomer, methyl methacrylate, a mixture of methyl methacrylate and butyl acrylate, and a mixture of methyl methacrylate and butyl methacrylate can be suitably used. In the case of using a mixture of methyl methacrylate with butyl acrylate or butyl methacrylate, the amount of butyl acrylate or butyl methacrylate is suitably 20% by weight or less of the polymer constituting the continuous phase. When the amount is 20% by weight or less, heat resistance does not lower excessively. Furthermore, in addition to the styrenic monomer and the (meth)acrylic ester monomer, other non-styrenic monomers such as acrylonitrile and methacrylonitrile may be used in combination. The amount of the other non-styrenic monomers is 50% by weight or less based on the total monomers.

The rubber-containing polymethacrylstyrene resin can be obtained by conventionally known processes. That is, a rubber-like elastic body is dissolved in a raw material solution comprising a styrenic monomer, a (meth)acrylic ester monomer, a polymerization solvent and a polymerization initiator. Then, the raw material solution in which the rubber-like elastic body is dissolved is charged in a reaction vessel with a stirrer, followed by carrying out polymerization at a temperature of 100-180° C. The polymerization temperature can be set using known technology considering productivity, heat removability of the reaction vessel, flowability of the desired rubber-containing polymethacrylstyrenic resin, etc. The diameter of the rubber particles which constitute the dispersed phase can be adjusted by controlling the number of revolution of the stirrer in accordance with known technology. After completion of polymerization, the product is treated under vacuum for removing unreacted monomer, polymerization solvent, and the like to obtain rubber-containing polymethacrylstyrenic resin. The proportion of the styrenic monomer to the total amount of the styrenic monomer and the (meth)acrylic ester monomer which constitute the continuous phase is 20% by weight or more, further preferably 30% by weight or more. If the proportion of the styrenic monomer is less than 20% by weight, flowability is conspicuously deteriorated and moldability may become inferior, which is not much preferred.

There are no restrictions in amount of the rubber-like elastic body in the rubber-containing polymethacrylstyrenic resin, particle diameter of rubber particles constituting the dispersed phase, etc., and the amount of the rubber-like elastic body is suitably 3-25% by weight. The diameter of the dispersed rubber particles is suitably 0.1-3.0 µm. The rubber-containing styrenic resin composition (A) of the present invention can also be used as a mixture of the rubber-containing polymethacrylstyrenic resin and other rubber-containing styrenic polymer. Furthermore, the composition (A) can be used as a mixture of the rubber-containing polymethacrylstyrenic resin and/or other rubber-containing styrenic polymer with a polymethacrylstyrenic resin containing no rubber and other styrenic polymer containing no rubber.

Moreover, the rubber-containing styrenic resin composition (A) in the present invention can contain a styrene-(meth)acrylic acid copolymer and/or a styrenic thermoplastic elastomer.

The styrene-(meth)acrylic acid copolymer in the present invention is a copolymer of a styrenic monomer and a (meth)acrylic acid monomer, and the content of (meth)acrylic acid monomer unit in the copolymer is 1-30% by weight, more preferably 5-15% by weight. If the content of the (meth)acrylic acid monomer in the copolymer exceeds 30% by weight, viscosity of melt increases to cause deterioration of extrusion moldability and processability, and thus deterioration of productivity, and besides a gel-like composition may be produced in a large amount during polymerization.

As the styrenic monomer in the above styrene-(meth)acrylic acid copolymer, mention may be made of, for example, styrene, α-alkyl-substituted styrenes such as o-methylstyrene, p-methylstyrene, m-methylstyrene, 2,4-dimethylstyrene, ethylstyrene and α-methylstyrene, isobutylstyrene, tert-butyl styrene, bromostyrene, and chlorostyrene. Among them, styrene is preferred because it is superior in reactivity with (meth)acrylic acid. The (meth)acrylic acid monomers in the styrene-(meth)acrylic acid copolymer include, for example, acrylic acid and methacrylic acid. Methacrylic acid is preferred from the point of easiness in production of the copolymer. The amount of the (meth)acrylic acid monomer in the rubber-containing styrenic resin composition is preferably 50% by weight or less. If it is added in an amount of more than 50% by weight, viscosity in melting increases and moldability may sometimes be deteriorated.

For producing the styrene-(meth)acrylic acid copolymer in the present invention, there are proposed various processes such as a continuous process (JP-A-56-161409) and a suspension polymerization process (JP-A-49-85184).

The styrenic thermoplastic elastomer in the present invention is not particularly limited, but styrene-butadiene block copolymer is suitable from the point of dispersibility. The content of butadiene component in the copolymer is suitably 30-80% by weight considering the effect of reinforcing the strength. Furthermore, the amount of the copolymer in the rubber-containing styrenic resin composition is preferably 30% by weight or less. When it is 30% by weight or less, rigidity can be maintained.

As mentioned above, the content of the rubber-like elastic body in the rubber-containing styrenic resin composition (A) can be selected. However, if the rubber content originating from the rubber-containing styrenic resin composition (A) is too small with respect to the total weight of the composition (A) and the inorganic filler (B), there sometimes occurs the problem of breakage during molding and cutting to desired shapes, or the drilling performance becomes insufficient. The rubber content originating from the rubber-containing styrenic resin composition (A) in the aiding plate material is preferably 2% by weight or more, further preferably 4% by weight or more based on the total weight of the rubber-containing styrenic resin composition (A) and the inorganic filler (B).

The inorganic fillers (B) in the present invention include, for example, talc, mica, calcium carbonate, wollastonite, titanium oxide, clay, carbon black, glass powders, glass flakes, glass fibers, etc. Wollastonite, talc and glass flakes are preferred, and wollastonite is more preferred. Wollastonite is a mineral having white needle-like crystals, and preferably has an average fiber length of 10-200 μm, an average fiber diameter of 2-30 μm and an average aspect ratio of 3-30. More preferably, it has an average fiber length of 10-200 μm, an average fiber diameter of 3-20 μm and an average aspect ratio of 1-9, and further preferably, it has an average fiber length of 10-100 μm, an average fiber diameter of 3-20 μm and an aspect ratio of 3-7. The average fiber length and average fiber diameter are measured by image analysis of electron microphotograph, and the aspect ratio is a ratio of the average fiber length and the average fiber diameter.

If the average fiber length and average fiber diameter are great, the drill has an excessively large shock at the time of drilling operation, and the drill is apt to be broken, which is not preferred. If the average fiber diameter is small and the aspect ratio is high, wollastonite is readily broken owing to shear stress applied during production and molding of the material. Therefore, the particle size of wollastonite during the molding is hardly stabilized to result in variation in drilling properties and cutting properties. In addition, breakage of wollastonite is apt to proceed with repetition of recycling by grinding the molded article as compared with the first molded article which uses the present material. Hence, there is a possibility of resulting in difference in drilling properties and cutting properties depending on the number of recycling. When the average fiber length, the average fiber diameter and the aspect ratio are within the above ranges, these problems do not occur. As wollastonite, there may also be used such wollastonite as surface treated with silane or the like.

The amount of the inorganic filler (B) to be added is preferably 80:20-40:60 as a weight ratio of the rubber-containing styrenic resin composition (A) and the inorganic filler (B). If the weight ratio of the inorganic filler (B) is less than 20%, the effect to diminish sticking of cutting powders to the drill is insufficient. On the other hand, if it is more than 60%, the density becomes higher and further the moldability is deteriorated. The weight ratio of the rubber-containing styrenic resin composition (A) and the inorganic filler (B) is more preferably 80:20-50:50.

The lubricant (C) used in the present invention includes, for example, higher fatty acids and metal salts thereof, higher aliphatic alcohols, fatty acid amides, fatty acid esters, etc. Among them, higher fatty acids and metal salts thereof are preferred. The higher fatty acids include, for example, lauric acid, myristic acid, palmitic acid, stearic acid, arachidic acid, behenic acid, etc. Stearic acid is especially preferred. The metal salts of higher fatty acids are generically salts of higher fatty acids with metals such as lithium, sodium, potassium, magnesium, calcium, aluminum and zinc. Representative metal salts of higher fatty acids are salts of higher fatty acids such as lauric acid, myristic acid, palmitic acid, stearic acid, arachidic acid and behenic acid with metals mentioned above. Among them, especially preferred are zinc stearate, calcium stearate, magnesium stearate, etc., and calcium stearate is most preferred. The higher fatty acids or metal salts of higher fatty acids as the lubricants (C) are preferably those of 12-22 carbon atoms.

The amount of the lubricant (C) based on 100 parts by weight in total of the rubber-containing styrenic resin composition (A) and the inorganic filler (B) is preferably 0.5 part by weight or more and 5 parts by weight or less, further preferably 1 part by weight or more and 3 parts by weight or less. When the amount is 0.5 part by weight or more, sticking of cutting powders to the drill and deposition of copper foils to the tip of drill can be diminished, and when it is 5 parts by weight or less, failure in molding due to excess lubricant is not caused in production of the material.

In addition to the inorganic filler (B) and the lubricant (C), antistatic agent, various stabilizers such as heat stabilizer, antioxidant and light stabilizer, ultraviolet absorber, dispersing agent, anti-fungus agent, nucleating agent, plasticizer, polymer processing aid, flame-retardant, silicone oil, dye, pigment and coloring agent can be optionally added to the material of the present invention by known methods. In producing the material of the present invention, the respective components are usually added by known methods. For example, mention may be made of a method of simultaneously adding all the components, or a method of preparing a high concentration master batch of styrenic resin (A) and inorganic filler (B), followed by further adding the components.

The method for producing the workpiece drilling and cutting operation aiding plate material of the present invention is not particularly limited, and known methods can be used. For example, there may be employed a method of dry blending using a mixer such as Banbury mixer or Henschel mixer, a method of kneading the respective components using various extruders, mixers, kneaders or rolls, and other methods. Preferred is a production method of using an extruder. In the case of kneading the respective components, they can be kneaded all together or kneaded by multi-stage addition method. The workpiece drilling and cutting operation aiding plate material of the present invention can be molded by molding methods such as injection molding, press molding, sheet-extrusion, contour extrusion, foam molding and blow molding. In this case, in order to obtain a smooth surface, it is preferred to sufficiently remove water by drying the material or by suction of water from a vent of extruder.

The workpiece drilling and cutting operation aiding plate material of the present invention can be widely used as industrial members, and can be particularly effectively used for the uses relating to electronic parts in which thermosetting resins are mainly used. For example, mention may be made of backup boards or entry boards used in drilling steps for substrates of printed circuit boards and entry boards used for cutting external shapes of substrates of printed circuit boards, and the like.

The method of material-recycling in the present invention is not particularly limited, and known methods can be used. According to the methods, the products can be reused in the form of materials by recovering the products, washing and grinding them, and removing impurities. They can be further pelletized using extruders. In molding them again, only the recycled materials can be used or the recycled materials and the workpiece drilling and cutting operation aiding plate material can be molded together.

EXAMPLES

The present invention will be explained in more detail by the following examples, which should not be construed as limiting the invention in any manner.

The evaluation methods of physical properties in the examples are as follows.

[Evaluation Methods of Physical Properties]

(1) Melt Flow Rate

This is measured in accordance with ISO1133 at 200° C., 49N, and is taken as an indication of flowability.

(2) Rubber Content

The content of butadiene rubber polymer (% by weight) in the polymerization solution is divided by the final polymerization solid content, and the thus obtained value is shown in % by weight as a rubber content.

This can also be measured by the following method. Using a pulse NMR apparatus (CKP-90 manufactured by Bruker Biospin GmbH), a signal intensity just after irradiation with solid echo pulse (90° x-τ-90° y pulse) is measured at a measuring frequency of 90 MHz and 30° C. using hydrogen nucleus as measuring nucleus, and this is assumed to be 100%. Furthermore, a signal intensity at a point of the time of 60 μs after the irradiation is measured, and a ratio of the resulting signal intensity to the signal intensity just after the irradiation is obtained, thereby to obtain a proportion (%) of hydrogen nucleus. When this value is assumed to be f(%), the reduced amount of rubber (% by weight) in the case of using polybutadiene rubber is calculated by the following equation.

$$\text{Reduced amount of rubber} = \{[54 \times f/6] \div [54 \times f/6 + 104(100-f)/8]\} \times 100$$

The rubber content can be determined by the calculated reduced amount of rubber on the basis of the reduced amount of rubber in a rubber-containing styrenic polymer the rubber content of which is known. For example, the reduced amount of rubber in a rubber-containing styrenic polymer having a rubber content of 6.6% by weight using a polybutadiene rubber (low cis type) is 8.7% by weight.

Furthermore, the rubber content based on the total weight of rubber-containing styrenic resin composition (A) and inorganic filler (B) is calculated from the rubber content in the rubber-containing styrenic resin composition (A) and the mixing ratio of (A) and (B), and the resulting rubber content is shown in % by weight.

(3) Dispersed Rubber Particle Diameter

The rubber-containing styrenic resin composition is dissolved in a solution of ammonium thiocyanate (1 vol %) in dimethylformamide, and a volume median diameter of the resulting sample obtained by a particle diameter distribution meter (Coulter Counter Multisizer available from by Nikkaki Co., Ltd.) is taken as the dispersed rubber particle diameter.

(4) Density

This is measured in accordance with ISO1183.

[Evaluation Method of Drilling Operation]

Seven substrates of printed circuit boards (heat resistant glass substrate and epoxy resin laminate FR-4 type, having a thickness of 0.1 mm, both surfaces of which are laminated with copper foils of 12 μm) are superposed, and a drilling operation aiding plate is disposed on the under surface and a resin-covered aluminum plate is disposed on the top surface. 2000 holes are bored through the laminates by a drill (under cut type with a diameter of 0.15 mm) using drilling machine at a number of revolution of 120,000 revolutions/min and at a velocity (lowering speed of drill) of 1.2 m/min. In this case, the cutting powders are removed by suction. After the drilling operation, the following evaluations are conducted.

(5) Sticking of Cutting Powders to Drill

The state of sticking of cutting powders to drill is judged in the following criteria.

○: There occurs no or slight sticking.

Δ: There occurs some sticking.

x: A large amount of sticking powders remain.

(6) Deposits on Tip of Drill

The state of presence of deposits such as copper foil fragments on tip of drill is judged in the following criteria.

○: There are seen no or slight deposits.

Δ: There are seen some deposits.

x: There are seen deposits over a wide area.

(7) Appearance of the Resin-Covered Aluminum Plate

The appearance of the resin-covered aluminum plate is judged in the following criteria.
○: There are seen no or slight stains.
Δ: There are seen some stains.
x: There are seen stains over a wide area.

[Evaluation Method of Cutting Operation]

Cutting operation aiding plates are disposed on the top and under surfaces of the laminate comprising the seven substrates of printed circuit boards superposed as in the above evaluation method of drilling operation. The resulting laminate is subjected to cutting operation by a router bit (1.0 mm in diameter×4.5 mm in length) at 30,000 rpm and a drill speed of 500 mm/min using an exterior shape working machine. After the cutting operation, the following evaluations are conducted.

(8) Melting of the Aiding Plate

The state of melting of the aiding plate after the cutting operation is judged in the following criteria.
○: There is seen no or slight melting.
Δ: There is seen some melting.
x: There is seen considerable melting.

(9) Resin Sticking to Substrate of Printed Circuit Boards

The state of sticking of the resin to the substrate after the cutting operation is judged in the following criteria.
○: There occurs no or slight sticking.
Δ: There occurs some sticking.
x: There occurs sticking over a wide area.

The rubber-containing styrenic resin composition (A), inorganic filler (B) and lubricant (C) used in examples and comparative examples are shown below.

The rubber-containing styrenic resin composition (A):

(A-1) Rubber-Containing Polymethacrylstyrenic Resin:

A rubber-containing polymethacrylstyrenic resin was continuously produced in the following manner using a polymerization apparatus comprising three reaction vessels provided with a stirrer which were connected in series and a twin-screw extruder with two-stage vent which was disposed behind the three reaction vessels. A starting material solution comprising 41.8 parts by weight of styrene, 40.2 parts by weight of methyl methacrylate, 6.5 parts by weight of a rubber-like elastic body of B-S type (B: butadiene block, S: styrene block) having a styrene content of 30% by weight, 15.0 parts by weight of ethylbenzene, and 0.02 part by weight of 1,1-bis(t-butylperoxy)cyclohexane was fed to the reaction vessels and polymerization was carried out. The polymerization temperature and residence time were 110° C.-2 hours, 120° C.-2.5 hours, and 150° C.-2.5 hours. The polymer solution continuously discharged from the polymerization reaction vessels was introduced into an extruder with vacuum vent and deaerated, followed by pelletizing. The resulting rubber-containing polymethacrylstyrenic resin had a composition of the continuous phase comprising 46.4% by weight of styrene and 44.6% by weight of methyl methacrylate. The content of rubber-like elastic body in the dispersed phase was 9% by weight, the particle diameter of dispersed particles was 0.9 μm, and the melt flow rate was 1.4 g/10 min.

(A-2) Rubber-Containing Styrenic Resin:

A rubber-containing styrenic resin was continuously produced using the same polymerization apparatus as in production of (A-1). A starting material solution comprising 82.3 parts by weight of styrene, 7.0 parts by weight of polybutadiene as a rubber-like elastic body (BR15HB manufactured by Ube Industries, Ltd.), 10.0 parts by weight of ethylbenzene, and 0.04 part by weight of 1,1-bis(t-butylperoxy)cyclohexane was fed to the reaction vessels, and a rubber-containing styrenic resin was produced in the same manner as in production of the rubber-containing styrenic polymer (A-1). The resulting rubber-containing styrenic resin (A-2) had a content of rubber-like elastic body of 8.8% by weight, a particle diameter of dispersed particles of 1.8 μm, and a melt flow rate of 3.0 g/10 min.

(A-3) Styrene-Methacrylic Acid Copolymer:

The styrene-methacrylic acid copolymer was produced in the following manner. A polymerization solution prepared by adding 0.01 part by weight of 1,1-bis(t-butylperoxy)3,3,5-trimethylcyclohexane to 100 parts by weight of a mixture comprising 80.3 parts by weight of styrene, 5.9 parts by weight of methacrylic acid, and 13.8 parts by weight of ethylbenzene was continuously charged in a polymerization apparatus having a completely mixing type reaction vessel at 1.00 liter/hr. The temperature of the completely mixing type reaction vessel was adjusted to 135° C. The polymer solution continuously discharged from the polymerization reaction vessel was introduced into an extruder with vacuum vent and deaerated, followed by pelletizing. The resulting styrene-methacrylic acid copolymer (A-3) had a content of methacrylic acid of 9.0% by weight and a melt flow rate of 1.6 g/10 min.

(A-4) Styrene-Butadiene Elastomer: TUFPRENE 125 (ratio by weight of styrene/butadiene=40/60) manufactured by Asahi Kasei Chemicals Corporation.

(A-5) Styrenic Resin Containing No Rubber: PSJ-Polystyrene G9305 Manufactured by PS Japan Corporation Inorganic Filler (B):

Wollastonite:

KH-30 (having an average fiber length of 100 μm, an average fiber diameter of 15 μm, and an aspect ratio of 7) and C-8 (having an average fiber length of 30 μm, an average fiber diameter of 10 μm, and an aspect ratio of 3) manufactured by JFE Mineral Co., Ltd.

KGP-H85 (having an average fiber length of 80 μm, an average fiber diameter of 9 μm, and an aspect ratio of 9) and KAP-370 (having an average fiber length of 70 μm, an average fiber diameter of 8 μm, and an aspect ratio of 9) manufactured by Kansai Matec Co., Ltd.

NYGLOS 20 (having an average fiber length of 260 μm, an average fiber diameter of 20 μm, and an aspect ratio of 13) manufactured by NYCO Minerals Inc.

Talc: MS-T manufactured by NIPPON TALC Co., Ltd.

Glass flake: EFH100-31 manufactured by Central Glass Co., Ltd.

Aluminum hydroxide: B103 manufactured by Nippon Light Metal Co., Ltd.

Lubricant (C):

Calcium stearate: DAIWAX C manufactured by Dainichi Chemical Industry Co., Ltd.

Zinc stearate: DAIWAX ZP (modified) manufactured by Dainichi Chemical Industry Co., Ltd.

Stearic acid: NAA-180 manufactured by NOF CORPORATION

Palmitic acid: LUNAC P-70 manufactured by Kao Corporation

Example 1

70 parts by weight of the rubber-containing polymethacrylstyrenic resin (A-1) as the component (A) and 30 parts by weight of wollastonite (KH-30) as the component (B) and 1 part by weight of calcium stearate as the component (C) based on 100 parts by weight in total of the components (A) and (B) were blended in the form of pellets. Then, the blend was kneaded using a twin-screw kneading machine (ZSK25 manufactured by WERNER & PFLEIDERER GmbH) at a screw speed of 300 rpm and a heater preset temperature of 240° C. while removing volatile matter and water from a vent to prepare pellets.

From the pellets, a drilling operation aiding plate was made using an injection molding machine (IS100G manufactured by Toshiba Machine Co., Ltd.) and a mold (2 mm thick×150 mm square) at a molding temperature of 240° C. Moreover, a cutting operation aiding plate was made by press molding at a heater temperature of 220° C. using a spacer of 1 mm thick×200 mm square. Evaluation was conducted on these aiding plates. The results are shown in Table 1.

Since the materials are comprised of the rubber-containing styrenic resin composition which was excellent in recyclability and the inorganic filler which was thermally stable, they were stable in quality when they were material-recycled.

Examples 2-10

Pellets were prepared in the same manner as in Example 1, except that the kind and blending ratio of the components (A)-(C) were changed as shown in Table 1, and various evaluations were conducted. The conditions and results are shown in Table 1.

Examples 11-20

Pellets were prepared in the same manner as in Example 1, except that the kind and blending ratio of the components (A)-(C) were changed as shown in Table 2, and various evaluations were conducted. The conditions and results are shown in Table 2.

Examples 21-25

Pellets were prepared in the same manner as in Example 1, except that the kind and blending ratio of the components (A)-(C) were changed as shown in Table 3, and various evaluations were conducted. The conditions and results are shown in Table 3.

Example 26

The aiding plate of Example 6 after used for drilling operation was washed and ground to obtain a ground product. The resulting ground product was injection molded in the same manner as in Example 1 to make a new drilling operation aiding plate. The results of evaluation on this aiding plate are shown in Table 3.

Example 27

As in Example 26, the aiding plate of Example 6 after used for cutting operation was washed and ground to obtain a ground product. The resulting ground product was press molded to make a new cutting operation aiding plate. The results of evaluation on this aiding plate are shown in Table 3.

Examples 28-29

Aiding plates were made and evaluated in the same manner as in Examples 26-27, except that each ground product of the drilling operation aiding plate and cutting operation aiding plate of Example 6 and the materials used in Example 6 were blended at a ratio of 70:30 (part by weight). The results are shown in Table 3.

Comparative Examples 1-7

Pellets were prepared in the same manner as in Example 1, except that the kind and blending ratio of the components (A)-(C) were changed as shown in Table 2, and various evaluations were conducted. However, since the results of evaluation on the drilling operation were inferior in Comparative Examples 1-7, the evaluation of cutting operation was not conducted. The conditions and results are shown in Table 4.

Reference Example 1

Pellets were prepared in the same manner as in Example 1 using a polypropylene (NORBLEN Y101 manufactured by Sumitomo Chemical Co., Ltd.) as a binder and aluminum hydroxide as shown in Table 5, and various evaluations were conducted.

The conditions and results are shown in Table 5. It was found that the density was extremely high in this case.

TABLE 1

| | | | Example | | | | | |
|---|---|---|---|---|---|---|---|---|
| | | | Example 1 | Example 2 | Example 3 | Example 4 | Example 5 | Example 6 |
| (A-1) Rubber-containing polymethacrylstyrenic resin | | Part by weight | 70 | 60 | 50 | 40 | 80 | 70 |
| (A-2) Rubber-containing styrenic resin | | Part by weight | — | — | — | — | — | — |
| (A-3) Styrene-methacrylic acid copolymer resin | | Part by weight | — | — | — | — | — | — |
| (A-4) Styrene-butadiene elastomer | TUFPRENE 125 | Part by weight | — | — | — | — | — | — |
| (A-5) Styrenic resin containing no rubber | G9305 | Part by weight | — | — | — | — | — | — |
| Composition of (A) | Rubber content | % by weight | 9 | 9 | 9 | 9 | 9 | 9 |
| Characteristics of (A) | Melt flow rate | g/10 min | 1.4 | 1.4 | 1.4 | 1.4 | 1.4 | 1.4 |
| | Dispersed rubber particle diameter | μm | 0.9 | 0.9 | 0.9 | 0.9 | 0.9 | 0.9 |

TABLE 1-continued

| | | | | | | | | | |
|---|---|---|---|---|---|---|---|---|---|
| (B) Inorganic filler | Wollastonite | KH-30 | Part by weight | 30 | 40 | 50 | 60 | 20 | — |
| | | C-8 | Part by weight | — | — | — | — | — | 30 |
| | | KGP-H85 | Part by weight | — | — | — | — | — | — |
| | | KAP-370 | Part by weight | — | — | — | — | — | — |
| | | NYGLOS 20 | Part by weight | — | — | — | — | — | — |
| | Talc | MS-T | Part by weight | — | — | — | — | — | — |
| | Glass flake | EFH100-31 | Part by weight | — | — | — | — | — | — |
| (C) Lubricant | Metal salt of higher fatty acid | Calcium stearate | Part by weight | 1 | 1 | 1 | 1 | 1 | 1 |
| | | Zinc stearate | Part by weight | — | — | — | — | — | — |
| | Higher fatty acid | Stearic acid | Part by weight | — | — | — | — | — | — |
| | | Palmitic acid | Part by weight | — | — | — | — | — | — |
| Total | | | Part by weight | 101 | 101 | 101 | 101 | 101 | 101 |
| Rubber content based on total weight of (A) and (B) | | | % by weight | 6.3 | 5.4 | 4.5 | 3.6 | 7.2 | 6.3 |
| Density | | | ×10³ kg/m³ | 1.35 | 1.45 | 1.6 | 1.77 | 1.26 | 1.36 |
| Evaluation of drilling operation | Sticking | | | ○ | ○ | ○ | ○ | ○ | ○ |
| | Abrasion of tip of drill and deposition thereon | | | ○ | ○ | ○ | ○ | ○ | ○ |
| | Appearance of resin-covered aluminum plate | | | ○ | ○ | ○ | ○ | ○ | ○ |
| Evaluation of cutting operation | Melting of aiding plate | | | ○ | ○ | ○ | ○ | ○ | ○ |
| | Resin sticking to substrate | | | ○ | ○ | ○ | ○ | ○ | ○ |

| | | | | Example | | | |
|---|---|---|---|---|---|---|---|
| | | | | Example 7 | Example 8 | Example 9 | Example 10 |
| (A-1) Rubber-containing polymethacrylstyrenic resin | | | Part by weight | 70 | 70 | 70 | 70 |
| (A-2) Rubber-containing styrenic resin | | | Part by weight | — | — | — | — |
| (A-3) Styrene-methacrylic acid copolymer resin | | | Part by weight | — | — | — | — |
| (A-4) Styrene-butadiene elastomer | TUFPRENE 125 | | Part by weight | — | — | — | — |
| (A-5) Styrenic resin containing no rubber | G9305 | | Part by weight | — | — | — | — |
| Composition of (A) | Rubber content | | % by weight | 9 | 9 | 9 | 9 |
| Characteristics of (A) | Melt flow rate | | g/10 min | 1.4 | 1.4 | 1.4 | 1.4 |
| | Dispersed rubber particle diameter | | μm | 0.9 | 0.9 | 0.9 | 0.9 |
| (B) Inorganic filler | Wollastonite | KH-30 | Part by weight | — | — | — | — |
| | | C-8 | Part by weight | — | — | — | — |
| | | KGP-H85 | Part by weight | 30 | — | — | — |
| | | KAP-370 | Part by weight | — | 30 | 30 | — |
| | | NYGLOS 20 | Part by weight | — | — | — | 30 |
| | Talc | MS-T | Part by weight | — | — | — | — |
| | Glass flake | EFH100-31 | Part by weight | — | — | — | — |
| (C) Lubricant | Metal salt of higher fatty acid | Calcium stearate | Part by weight | 1 | 1 | 5 | 1 |
| | | Zinc stearate | Part by weight | — | — | — | — |
| | Higher fatty acid | Stearic acid | Part by weight | — | — | — | — |
| | | Palmitic acid | Part by weight | — | — | — | — |
| Total | | | Part by weight | 101 | 101 | 105 | 101 |
| Rubber content based on total weight of (A) and (B) | | | % by weight | 6.3 | 6.3 | 6.3 | 6.3 |
| Density | | | ×10³ kg/m³ | 1.35 | 1.35 | 1.34 | 1.35 |
| Evaluation of drilling operation | Sticking | | | ○ | ○ | Δ | ○ |
| | Abrasion of tip of drill and deposition thereon | | | ○ | ○ | ○ | Δ |
| | Appearance of resin-covered aluminum plate | | | ○ | ○ | ○ | ○ |

TABLE 1-continued

|  |  |  |  |  |  |
|---|---|---|---|---|---|
| Evaluation of cutting operation | Melting of aiding plate | ○ | ○ | ○ | ○ |
|  | Resin sticking to substrate | ○ | ○ | ○ | ○ |

TABLE 2

|  |  |  | Example 11 | Example 12 | Example 13 | Example 14 | Example 15 |
|---|---|---|---|---|---|---|---|
| (A-1) Rubber-containing polymethacrylstyrenic resin |  | Part by weight | 70 | 70 | 70 | 70 | 70 |
| (A-2) Rubber-containing styrenic resin |  | Part by weight | — | — | — | — | — |
| (A-3) Styrene-methacrylic acid copolymer resin |  | Part by weight | — | — | — | — | — |
| (A-4) Styrene-butadiene elastomer | TUFPRENE 125 | Part by weight | — | — | — | — | — |
| (A-5) Styrenic resin containing no rubber | G9305 | Part by weight | — | — | — | — | — |
| Composition of (A) | Rubber content | % by weight | 9 | 9 | 9 | 9 | 9 |
| Characteristics of (A) | Melt flow rate | g/10 min | 1.4 | 1.4 | 1.4 | 1.4 | 1.4 |
|  | Dispersed rubber particle diameter | μm | 0.9 | 0.9 | 0.9 | 0.9 | 0.9 |
| (B) Inorganic filler | Wollastonite KH-30 | Part by weight | 30 | 30 | 30 | 30 | 30 |
|  | C-8 | Part by weight | — | — | — | — | — |
|  | KGP-H85 | Part by weight | — | — | — | — | — |
|  | KAP-370 | Part by weight | — | — | — | — | — |
|  | NYGLOS 20 | Part by weight | — | — | — | — | — |
|  | Talc MS-T | Part by weight | — | — | — | — | — |
|  | Glass flake EFH100-31 | Part by weight | — | — | — | — | — |
| (C) Lubricant | Metal salt of higher fatty acid Calcium stearate | Part by weight | — | 0.5 | 3 | — | — |
|  | Zinc stearate | Part by weight | — | — | — | 1 | — |
|  | Higher fatty acid Stearic acid | Part by weight | — | — | — | — | 1 |
|  | Palmitic acid | Part by weight | — | — | — | — | — |
| Total |  | Part by weight | 100 | 101 | 103 | 101 | 101 |
| Rubber content based on total weight of (A) and (B) |  | % by weight | 6.3 | 6.3 | 6.3 | 6.3 | 6.3 |
| Density |  | ×10³ kg/m³ | 1.35 | 1.35 | 1.34 | 1.35 | 1.35 |
| Evaluation of drilling operation | Sticking |  | Δ | ○ | ○ | ○ | ○ |
|  | Abrasion of tip of drill and deposition thereon |  | Δ | ○ | ○ | ○ | ○ |
|  | Appearance of resin-covered aluminum plate |  | ○ | ○ | ○ | ○ | ○ |
| Evaluation of cutting operation | Melting of aiding plate |  | ○ | ○ | ○ | ○ | ○ |
|  | Resin sticking to substrate |  | ○ | ○ | ○ | ○ | ○ |

|  |  |  | Example 16 | Example 17 | Example 18 | Example 19 | Example 20 |
|---|---|---|---|---|---|---|---|
| (A-1) Rubber-containing polymethacrylstyrenic resin |  | Part by weight | 70 | 70 | 56 | 46 | — |
| (A-2) Rubber-containing styrenic resin |  | Part by weight | — | — | — | — | 70 |
| (A-3) Styrene-methacrylic acid copolymer resin |  | Part by weight | — | — | 7 | 7 | — |
| (A-4) Styrene-butadiene elastomer | TUFPRENE 125 | Part by weight | — | — | 7 | 7 | — |
| (A-5) Styrenic resin containing no rubber | G9305 | Part by weight | — | — | — | — | — |
| Composition of (A) | Rubber content | % by weight | 9 | 9 | 13.2 | 13.9 | 8.8 |
| Characteristics of (A) | Melt flow rate | g/10 min | 1.4 | 1.4 | 1.9 | 2.1 | 3 |

TABLE 2-continued

|  |  |  |  |  |  |  |  |  |
|---|---|---|---|---|---|---|---|---|
|  | Dispersed rubber particle diameter |  | μm | 0.9 | 0.9 | 0.9 | 0.9 | 1.8 |
| (B) Inorganic filler | Wollastonite | KH-30 | Part by weight | 30 | 30 | 30 | 40 | 30 |
|  |  | C-8 | Part by weight | — | — | — | — | — |
|  |  | KGP-H85 | Part by weight | — | — | — | — | — |
|  |  | KAP-370 | Part by weight | — | — | — | — | — |
|  |  | NYGLOS 20 | Part by weight | — | — | — | — | — |
|  | Talc | MS-T | Part by weight | — | — | — | — | — |
|  | Glass flake | EFH100-31 | Part by weight | — | — | — | — | — |
| (C) Lubricant | Metal salt of higher fatty acid | Calcium stearate | Part by weight | — | — | 1 | 1 | 1 |
|  |  | Zinc stearate | Part by weight | — | — | — | — | — |
|  | Higher fatty acid | Stearic acid | Part by weight | 3 | — | — | — | — |
|  |  | Palmitic acid | Part by weight | — | 1 | — | — | — |
| Total |  |  | Part by weight | 103 | 101 | 101 | 101 | 101 |
| Rubber content based on total weight of (A) and (B) |  |  | % by weight | 6.3 | 6.3 | 9.2 | 8.3 | 6.2 |
| Density |  |  | ×10$^3$ kg/m$^3$ | 1.34 | 1.35 | 1.33 | 1.43 | 1.27 |
| Evaluation of drilling operation | Sticking |  |  | ○ | ○ | ○ | ○ | ○ |
|  | Abrasion of tip of drill and deposition thereon |  |  | ○ | ○ | ○ | ○ | ○ |
|  | Appearance of resin-covered aluminum plate |  |  | ○ | ○ | ○ | ○ | ○ |
| Evaluation of cutting operation | Melting of aiding plate |  |  | ○ | ○ | ○ | ○ | ○ |
|  | Resin sticking to substrate |  |  | ○ | ○ | ○ | ○ | ○ |

TABLE 3

|  |  |  |  | Example |  |  |  |  |
|---|---|---|---|---|---|---|---|---|
|  |  |  |  | Example 21 | Example 22 | Example 23 | Example 24 | Example 25 |
| (A-1) Rubber-containing polymethacrylstyrenic resin |  |  | Part by weight | — | — | 70 | 70 | 70 |
| (A-2) Rubber-containing styrenic resin |  |  | Part by weight | 60 | 17.5 | — | — | — |
| (A-3) Styrene-methacrylic acid copolymer resin |  |  | Part by weight | — | — | — | — | — |
| (A-4) Styrene-butadiene elastomer | TUFPRENE 125 |  | Part by weight | — | — | — | — | — |
| (A-5) Styrenic resin containing no rubber | G9305 |  | Part by weight | — | 52.5 | — | — | — |
| Composition of (A) | Rubber content |  | % by weight | 8.8 | 2.2 | 9 | 9 | 9 |
| Characteristics of (A) | Melt flow rate |  | g/10 min | 3 | 2.2 | 1.4 | 1.4 | 1.4 |
|  | Dispersed rubber particle diameter |  | μm | 1.8 | 1.8 | 0.9 | 0.9 | 0.9 |
| (B) Inorganic filler | Wollastonite | KH-30 | Part by weight | 40 | 30 | — | — | — |
|  |  | C-8 | Part by weight | — | — | — | — | — |
|  |  | KGP-H85 | Part by weight | — | — | — | — | — |
|  |  | KAP-370 | Part by weight | — | — | — | — | — |
|  |  | NYGLOS 20 | Part by weight | — | — | — | — | — |
|  | Talc | MS-T | Part by weight | — | — | 30 | 30 | — |
|  | Glass flake | EFH100-31 | Part by weight | — | — | — | — | 30 |
| (C) Lubricant | Metal salt of higher fatty acid | Calcium stearate | Part by weight | 1 | 1 | 1 | 3 | 1 |
|  |  | Zinc stearate | Part by weight | — | — | — | — | — |
|  | Higher fatty acid | Stearic acid | Part by weight | — | — | — | — | — |
|  |  | Palmitic acid | Part by weight | — | — | — | — | — |
| Total |  |  | Part by weight | 101 | 101 | 101 | 103 | 101 |
| Rubber content based on total weight of (A) and (B) |  |  | % by weight | 5.3 | 1.5 | 6.3 | 6.3 | 6.3 |

TABLE 3-continued

| | | | | | | | |
|---|---|---|---|---|---|---|---|
| Density | | ×10³ kg/m³ | 1.37 | 1.28 | 1.4 | 1.39 | 1.42 |
| Evaluation of drilling operation | Sticking | | ○ | Δ | ○ | ○ | ○ |
| | Abrasion of tip of drill and deposition thereon | | ○ | ○ | ○ | ○ | ○ |
| | Appearance of resin-covered aluminum plate | | ○ | ○ | ○ | ○ | ○ |
| Evaluation of cutting operation | Melting of aiding plate | | ○ | ○ | ○ | ○ | ○ |
| | Resin sticking to substrate | | ○ | ○ | ○ | ○ | ○ |

| | | | Example | | | |
|---|---|---|---|---|---|---|
| | | | Example 26 | Example 27 | Example 28 | Example 29 |
| (A-1) Rubber-containing polymethacrylstyrenic resin | | Part by weight | | | | |
| (A-2) Rubber-containing styrenic resin | | Part by weight | | | | |
| (A-3) Styrene-methacrylic acid copolymer resin | | Part by weight | | | | |
| (A-4) Styrene-butadiene elastomer | TUFPRENE 125 | Part by weight | | | | |
| (A-5) Styrenic resin containing no rubber | G9305 | Part by weight | | | | |
| Composition of (A) | Rubber content | % by weight | | | | |
| Characteristics of (A) | Melt flow rate | g/10 min | | | | |
| | Dispersed rubber particle diameter | μm | | | | |
| (B) Inorganic filler | Wollastonite | KH-30 | Part by weight | ground product of drilling operation aiding plate of Example 6 (100 parts by weight) | ground product of cutting operation aiding plate of Example 6 (100 parts by weight) | ground product of drilling operation aiding plate of Example 6 (70 parts by weight) + raw materials of Example 6 (30 parts by weight) | ground product of cutting operation aiding plate of Example 6 (70 parts by weight) + raw materials of Example 6 (30 parts by weight) |
| | | C-8 | Part by weight | | | | |
| | | KGP-H85 | Part by weight | | | | |
| | | KAP-370 | Part by weight | | | | |
| | | NYGLOS 20 | Part by weight | | | | |
| | Talc | MS-T | Part by weight | | | | |
| | Glass flake | EFH100-31 | Part by weight | | | | |
| (C) Lubricant | Metal salt of higher fatty acid | Calcium stearate | Part by weight | | | | |
| | | Zinc stearate | Part by weight | | | | |
| | Higher fatty acid | Stearic acid | Part by weight | | | | |
| | | Palmitic acid | Part by weight | | | | |
| Total | | | Part by weight | 100 | 100 | 100 | 100 |
| Rubber content based on total weight of (A) and (B) | | | % by weight | 6.3 | 6.3 | 6.3 | 6.3 |
| Density | | | ×10³ kg/m³ | 1.36 | 1.36 | 1.36 | 1.36 |
| Evaluation of drilling operation | Sticking | | | ○ | | ○ | |
| | Abrasion of tip of drill and deposition thereon | | | ○ | | ○ | |
| | Appearance of resin-covered aluminum plate | | | ○ | | ○ | |
| Evaluation of cutting operation | Melting of aiding plate | | | | ○ | | ○ |
| | Resin sticking to substrate | | | | ○ | | ○ |

TABLE 4

| | | | | Comparative Example | | | | | | |
|---|---|---|---|---|---|---|---|---|---|---|
| | | | | Comparative Example 1 | Comparative Example 2 | Comparative Example 3 | Comparative Example 4 | Comparative Example 5 | Comparative Example 6 | Comparative Example 7 |
| (A-1) Rubber-containing polymethacrylstyrenic resin | | | Part by weight | 100 | 100 | 90 | 30 | — | — | — |
| (A-5) Styrenic resin containing no rubber | | G9305 | Part by weight | — | — | — | — | 100 | 90 | 70 |
| Composition of (A) | Rubber content | | % by weight | 9 | 9 | 9 | 9 | 0 | 0 | 0 |
| Characteristics of (A) | Melt flow rate | | g/10 min | 1.4 | 1.4 | 1.4 | 1.4 | 1.5 | 1.5 | 1.5 |
| | Dispersed rubber particle diameter | | μm | 0.9 | 0.9 | 0.9 | 0.9 | — | — | — |
| (B) Inorganic filler | Wollastonite | KH-30 | Part by weight | — | — | 10 | 70 | — | 10 | 30 |
| (C) Lubricant | Metal salt of higher fatty acid | Calcium stearate | Part by weight | — | 1 | — | — | — | — | 1 |
| Total | | | Part by weight | 100 | 101 | 100 | 100 | 100 | 100 | 101 |
| Rubber content based on total weight of (A) and (B) | | | % by weight | 9 | 9 | 8.1 | 2.7 | 0 | 0 | 0 |
| Density | | | ×10³ kg/m³ | 1.07 | 1.07 | 1.2 | 1.89 | 1.05 | 1.18 | 1.34 |
| Evaluation of drilling operation | Sticking | | | x | x | x | Δ | x | x | x |
| | Abrasion of tip of drill and deposition thereon | | | x | x | x | x | x | x | Δ |
| | Appearance of resin-covered aluminum plate | | | x | x | x | x | x | x | x |

TABLE 5

| Reference Example | | | | Reference Example 1 |
|---|---|---|---|---|
| Polypropylene | | NORBLEN Y101 | Part by weight | 100 |
| (B) Inorganic filler | Aluminum hydroxide | B103 | Part by weight | 350 |
| Total | | | Part by weight | 450 |
| Density | | | ×10³ kg/m³ | 2.3 |
| Evaluation of drilling operation | Sticking | | | ○ |
| | Abrasion of tip of drill and deposition thereon | | | Δ |
| | Appearance of resin-covered aluminum plate | | | ○ |

INDUSTRIAL APPLICABILITY

The workpiece drilling and cutting operation aiding plate materials and the molded articles made from the same according to the present invention are low in specific gravity and excellent in drilling properties and cutting properties, and can be recycled. Therefore, they can be widely used as industrial members. Particularly, they can be effectively utilized in the uses relating to electronic parts mainly containing a thermosetting resin.

DESCRIPTION OF REFERENCE NUMERALS

Figure 1:
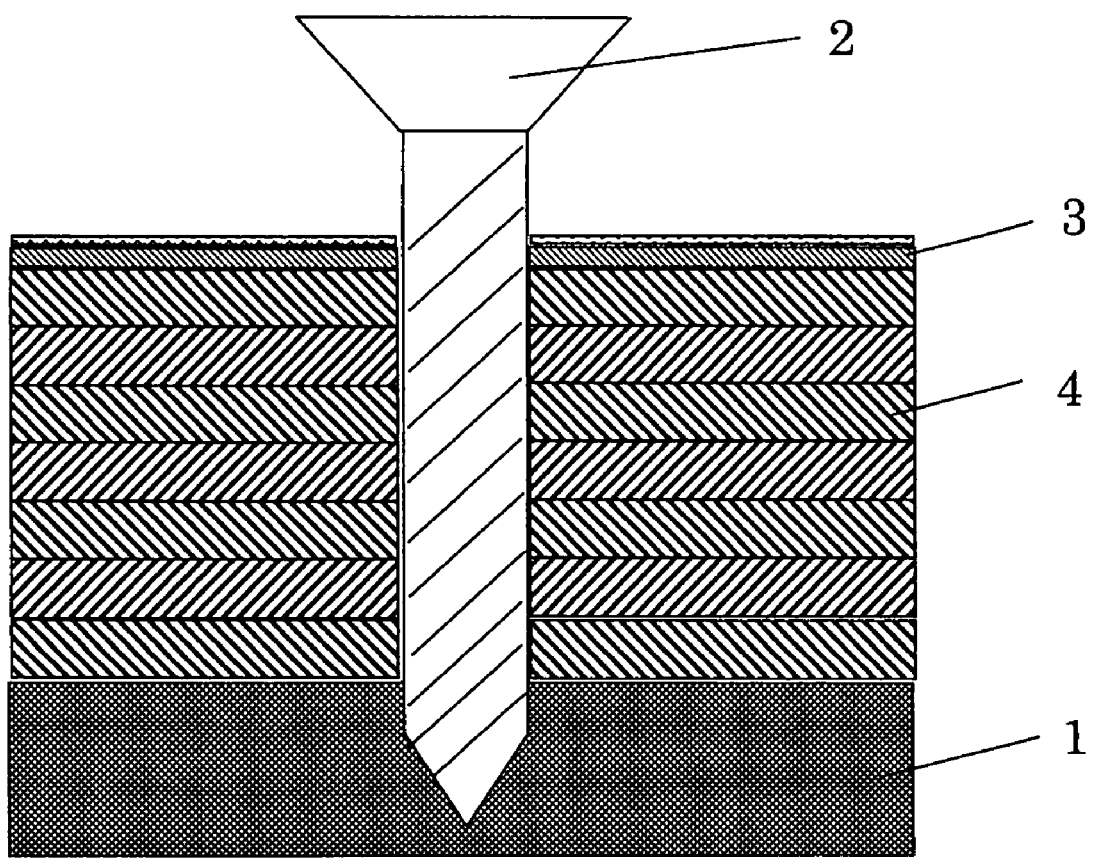
FIG. 1 is a schematic view showing the state of use of the drilling operation aiding plate of the present invention for substrates of printed circuit board.

1: Drilling operation aiding plate
2: Drill
3: Aluminum plate with resin
4: Substrate

The invention claimed is:

1. A workpiece drilling and cutting operation aiding plate material which comprises a rubber-containing styrenic resin composition (A) and an inorganic filler (B) in a weight ratio of 80:20-40:60, wherein the inorganic filler (B) is wollastonite.

2. The workpiece drilling and cutting operation aiding plate material according to claim 1 which additionally comprises a lubricant (C) in an amount of 0.5-5 parts by weight based on 100 parts by weight in total of the rubber-containing styrenic resin composition (A) and the inorganic filler (B).

3. The workpiece drilling and cutting operation aiding plate material according to claim 2, wherein the lubricant (C) is a higher fatty acid or a metal salt thereof.

4. The workpiece drilling and cutting operation aiding plate material according to claim 1, wherein a rubber content originating from the rubber-containing styrene resin composition (A) is 2% by weight or more based on the total weight of the rubber-containing styrenic resin composition (A) and the inorganic filler (B).

5. The workpiece drilling and cutting operation aiding plate material according to claim 1, wherein the inorganic filler (B) is wollastonite having an aspect ratio of 3-30.

6. The workpiece drilling and cutting operation aiding plate material according to claim 1, wherein the inorganic filler (B) is wollastonite having an average fiber length of 10-200 μm and an average fiber diameter of 2-30 μm.

7. The workpiece drilling and cutting operation aiding plate material according to claim 1, wherein the inorganic filler (B) is wollastonite having an average fiber length of 10-200 μm, an average fiber diameter of 3-20 μm, and an aspect ratio of 1-9.

8. A molded article made from the workpiece drilling and cutting operation aiding plate material according to claim 1.

9. A molded article made by molding a ground product and/or a pelletized product of the molded article according to claim 8 which has been used.

10. A molded article made by molding a workpiece drilling and cutting operation aiding plate material together with a ground product and/or a pelletized product of the molded article according to claim 8;

wherein the workpiece drilling and cutting operation aiding plate material comprises a rubber-containing styrenic resin composition (A) and an inorganic filler (B) in a weight ratio of 80:20-40:60, wherein the inorganic filler (B) is wollastonite.

11. The molded article according to any one of claims 8-10 which is used as a backup board or an entry board.

* * * * *